United States Patent
Hashinaga et al.

(10) Patent No.: US 12,199,572 B2
(45) Date of Patent: Jan. 14, 2025

(54) HIGH-FREQUENCY AMPLIFIER

(71) Applicant: SUMITOMO ELECTRIC INDUSTRIES, LTD., Osaka (JP)

(72) Inventors: Tatsuya Hashinaga, Osaka (JP); Yutaka Moriyama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 494 days.

(21) Appl. No.: 17/753,371

(22) PCT Filed: Dec. 25, 2020

(86) PCT No.: PCT/JP2020/048985
§ 371 (c)(1),
(2) Date: Mar. 1, 2022

(87) PCT Pub. No.: WO2021/140975
PCT Pub. Date: Jul. 15, 2021

(65) Prior Publication Data
US 2022/0329209 A1    Oct. 13, 2022

(30) Foreign Application Priority Data

Jan. 10, 2020 (JP) ................. 2020-002865
Feb. 13, 2020 (JP) ................. 2020-022128

(51) Int. Cl.
*H03F 1/02* (2006.01)
*H03F 3/19* (2006.01)

(52) U.S. Cl.
CPC ............. *H03F 1/0288* (2013.01); *H03F 3/19* (2013.01)

(58) Field of Classification Search
CPC ................................ H03F 1/0288; H03F 3/19
USPC ........................................................ 330/295
See application file for complete search history.

(56) References Cited

U.S. PATENT DOCUMENTS

| | | | |
|---|---|---|---|
| 10,250,197 B1 * | 4/2019 | Schultz | H01L 23/66 |
| 11,557,554 B2 * | 1/2023 | Moriwaki | H05K 3/46 |
| 11,942,911 B2 * | 3/2024 | Ohhashi | H03F 1/0288 |
| 11,955,732 B2 * | 4/2024 | Alpman | H01Q 3/24 |
| 2002/0025794 A1 | 2/2002 | Tamaki et al. | |

(Continued)

FOREIGN PATENT DOCUMENTS

| | | |
|---|---|---|
| JP | 2002-076241 | 3/2002 |
| JP | 2006-049661 | 2/2006 |

(Continued)

*Primary Examiner* — Hafizur Rahman
(74) *Attorney, Agent, or Firm* — IPUSA, PLLC

(57) ABSTRACT

A high-frequency amplifier includes a driver amplifier, a Doherty amplifier including carrier and peak which amplify the driver amplifier output, a second substrate laminated on a first substrate, and a base member mounted with the first and second substrates. The driver amplifier is mounted on the second substrate, and the carrier and peak amplifiers are mounted on the first substrate. A front surface of the driver amplifier opposes the first substrate, and a back surface of the driver amplifier is separated from the first substrate. Back surfaces of the carrier and peak amplifiers contact the base member, and the back surface of the driver amplifier connects to an interconnect layer disposed on the second substrate and connected to one end of a via penetrating the second and first substrates, and the other end of the via connects to the base member.

12 Claims, 9 Drawing Sheets

(56) References Cited

U.S. PATENT DOCUMENTS

| | | |
|---|---|---|
| 2003/0169575 A1 | 9/2003 | Ikuta et al. |
| 2007/0164819 A1* | 7/2007 | Urata .................... H03F 1/0288 |
| | | 330/124 R |
| 2008/0111226 A1* | 5/2008 | White .................... H01L 25/16 |
| | | 257/E23.167 |
| 2008/0304237 A1 | 12/2008 | Shiraishi |
| 2009/0039965 A1 | 2/2009 | Block et al. |
| 2012/0217625 A1 | 8/2012 | Mohan et al. |
| 2018/0063940 A1 | 3/2018 | Railkar et al. |
| 2021/0005578 A1 | 1/2021 | Matsumoto |
| 2023/0253339 A1* | 8/2023 | McLaren ................ H01L 23/66 |
| | | 257/659 |

FOREIGN PATENT DOCUMENTS

| | | |
|---|---|---|
| JP | 2006-121147 | 5/2006 |
| JP | 2008-305937 | 12/2008 |
| JP | 2008-544612 | 12/2008 |
| JP | 2012-065117 | 3/2012 |
| JP | 2013-074249 | 4/2013 |
| JP | 2019-087992 | 6/2019 |
| WO | 2005/093948 | 10/2005 |
| WO | 2019/181589 | 9/2019 |

* cited by examiner

HIGH-FREQUENCY AMPLIFIER

TECHNICAL FIELD

The present disclosure relates to high-frequency amplifiers.

This application is based upon and claims priority to Japanese Patent Application No. 2020-002865 filed on Jan. 10, 2020, and Japanese Patent Application No. 2020-022128 filed on Feb. 13, 2020, the entire contents of which are incorporated herein by reference.

BACKGROUND ART

In recent years, mobile communication systems of mobile phones or the like are proceeding to broadband. For this reason, a power amplifier used in a base station device or the like of the system desirably has a high power efficiency in a high frequency band or the like. A Doherty amplifier having a carrier amplifier (also referred to as a main amplifier), and a peak amplifier, is known as the power amplifier for achieving this high power efficiency. For example, Patent Document 1 describes a structure of the Doherty amplifier (Doherty type amplifier). The Doherty amplifier is normally used in a state connected to a stage subsequent to a driver amplifier.

PRIOR ART DOCUMENTS

Patent Documents

Patent Document 1: International Publication Pamphlet No. WO 2005/093948
Patent Document 2: Japanese Laid-Open Patent Publication No. 2008-305937

DISCLOSURE OF THE INVENTION

A high-frequency amplifier according to one aspect of the present disclosure includes a driver amplifier configured to amplify an input high-frequency signal; a Doherty amplifier, including a carrier amplifier and a peak amplifier, and configured to further amplify a signal output from the driver amplifier; a first multilayer substrate; a second multilayer substrate laminated to overlap the first multilayer substrate; and a base member mounted with the first multilayer substrate and the second multilayer substrate, wherein the driver amplifier is mounted on the second multilayer substrate, the carrier amplifier and the peak amplifier are mounted on the first multilayer substrate, the driver amplifier, the carrier amplifier, and the peak amplifier have a front surface forming a predetermined circuit, and a back surface located on an opposite side from the front surface, respectively, the front surface of the driver amplifier opposes the first multilayer substrate, and the back surface of the driver amplifier is separated from the first multilayer substrate, the back surfaces of the carrier amplifier and the peak amplifier both make contact with the base member, respectively, and the back surface of the driver amplifier is connected to an interconnect layer disposed on a surface of the second multilayer substrate, the interconnect layer is connected to one end of a first via penetrating the second multilayer substrate and the first multilayer substrate, and the other end of the first via is connected to the base member.

A high-frequency amplifier according to one aspect of the present disclosure includes a first amplifier configured to amplify an input high-frequency signal; a second amplifier and a third amplifier configured to further amplify a signal output from the first amplifier; a first multilayer substrate; a second multilayer substrate laminated to overlap the first multilayer substrate; and a base member mounted with the first multilayer substrate and the second multilayer substrate, wherein the first amplifier is mounted on the second multilayer substrate, the second amplifier and the third amplifier are mounted on the first multilayer substrate, the first amplifier, the second amplifier, and the third amplifier have a front surface forming a predetermined circuit, and a back surface located on an opposite side from the front surface, respectively, the front surface of the first amplifier opposes the first multilayer substrate, and the back surface of the first amplifier is separated from the first multilayer substrate, the back surfaces of the second amplifier and the third amplifier both make contact with the base member, respectively, the back surface of the first amplifier is connected to an interconnect layer disposed on a surface of the second multilayer substrate, the interconnect layer is connected to one end of a first via penetrating the second multilayer substrate and the first multilayer substrate, and the other end of the first via is connected to the base member, and a power consumption of the first amplifier is smaller than a power consumption of each of the second amplifier and the third amplifier.

A high-frequency amplifier according to one aspect of the present disclosure includes a driver amplifier configured to amplify an input high-frequency signal; a Doherty amplifier, including a carrier amplifier and a peak amplifier, and configured to further amplify a signal output from the driver amplifier; a first multilayer substrate; a second multilayer substrate laminated to overlap the first multilayer substrate; and a base member mounted with the first multilayer substrate and the second multilayer substrate, wherein the driver amplifier is mounted on the second multilayer substrate, the carrier amplifier and the peak amplifier are mounted on the first multilayer substrate, the driver amplifier, the carrier amplifier, and the peak amplifier have a front surface forming a predetermined circuit, and a back surface located on an opposite side from the front surface, respectively, the back surface of the driver amplifier opposes the first multilayer substrate, and the front surface of the driver amplifier is separated from the first multilayer substrate, the back surfaces of the carrier amplifier and the peak amplifier both make contact with the base member, respectively, and the back surface of the driver amplifier is connected to one end of a first via penetrating a layer forming a portion of the second multilayer substrate and in contact with the first multilayer substrate, and the first multilayer substrate, and the other end of the first via is connected to the base member.

A high-frequency amplifier according to one aspect of the present disclosure includes a first amplifier configured to amplify an input high-frequency signal; a second amplifier and a third amplifier configured to further amplify a signal output from the first amplifier; a first multilayer substrate; a second multilayer substrate laminated to overlap the first multilayer substrate; and a base member mounted with the first multilayer substrate and the second multilayer substrate, wherein the first amplifier is mounted on the second multilayer substrate, the second amplifier and the third amplifier are mounted on the first multilayer substrate, the first amplifier, the second amplifier, and the third amplifier have a front surface forming a predetermined circuit, and a back surface located on an opposite side from the front surface, respectively, the back surface of the first amplifier opposes the first multilayer substrate, and the front surface of the first amplifier is separated from the first multilayer substrate, the back surfaces of the second amplifier and the third amplifier both make contact with the base member, respectively, the back surface of the first amplifier is connected to one end of a first via penetrating a layer forming a portion of the second multilayer substrate and in contact with the first multilayer substrate, and the first multilayer substrate, and the other end of the first via is connected to the base member, and a power consumption of the first amplifier is less than a power consumption of each of the second amplifier and the third amplifier.

MODE OF CARRYING OUT THE INVENTION

Figure 1:
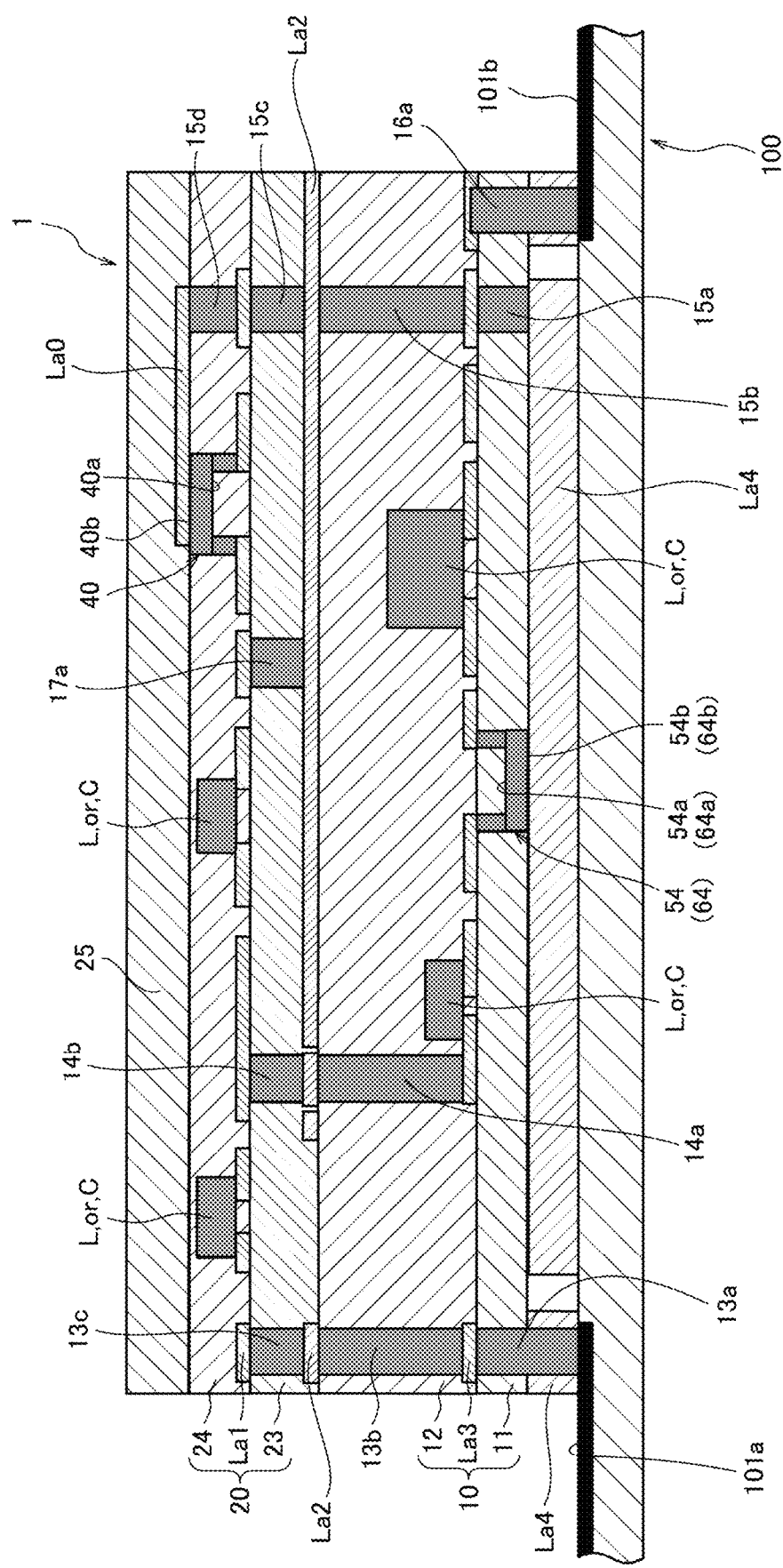
FIG. 1 is a cross sectional view schematically illustrating a high-frequency amplifier according to one aspect of the present disclosure.

Problems to be Solved by the Present Disclosure

When mounting a driver amplifier and a Doherty amplifier on a printed circuit board, the printed circuit board needs to have a large size if the driver amplifier, a carrier amplifier, and a peak amplifier were to be mounted on the same plane, thereby making it difficult to reduce the size of the amplifier. On the other hand, as a means for a general minimum area mounting, there is a method corresponding to a three-dimensional mounting (Patent Document 2).
Because the high-frequency amplifier (high-frequency power amplifier) targeted by the present disclosure amplifies an input high-frequency signal to a required output, the power that is treated is large, and the current consumption or the power consumption is large. As a result, an amount of heat that is generated is large. For this reason, compared to a two-dimensional mounting in which a plurality of high-frequency amplifiers are mounted on the same plane, a three-dimensional mounting which employs three-dimensional laminating to reduce the size may deteriorate heat dissipation properties.
The present disclosure is conceived in view of the above described circumstances, and one object is to provide a high-frequency amplifier that has a small size and excellent heat dissipation properties.

Effects of the Present Disclosure

According to the present disclosure, it is possible to provide a high-frequency amplifier having a small size and excellent heat dissipation properties.

DESCRIPTION OF EMBODIMENTS OF THE PRESENT DISCLOSURE

First, details of embodiments of the present disclosure will be described in the following.
(1) A high-frequency amplifier according to the present disclosure includes a driver amplifier configured to amplify an input high-frequency signal; a Doherty amplifier, including a carrier amplifier and a peak amplifier, and configured to further amplify a signal output from the driver amplifier; a first multilayer substrate; a second multilayer substrate laminated to overlap the first multilayer substrate; and a base member mounted with the first multilayer substrate and the second multilayer substrate, wherein the driver amplifier is mounted on the second multilayer substrate, the carrier amplifier and the peak amplifier are mounted on the first multilayer substrate, the driver amplifier, the carrier amplifier, and the peak amplifier have a front surface forming a predetermined circuit, and a back surface located on an opposite side from the front surface, respectively, the front surface of the driver amplifier opposes the first multilayer substrate, and the back surface of the driver amplifier is separated from the first multilayer substrate, the back surfaces of the carrier amplifier and the peak amplifier both make contact with the base member, respectively, and the back surface of the driver amplifier is connected to an interconnect layer disposed on a surface of the second multilayer substrate, the interconnect layer is connected to one end of a first via penetrating the second multilayer substrate and the first multilayer substrate, and the other end of the first via is connected to the base member.
The driver amplifier and the Doherty amplifier are configured by a two-level structure including the first multilayer substrate and the second multilayer substrate. Hence, it is possible to reduce the size of the high-frequency amplifier. In addition, the packaging density can be increased because the driver amplifier is disposed to oppose the carrier amplifier and the peak amplifier. The back surfaces of the carrier amplifier and the peak amplifier are both in contact with the base member, to achieve heat dissipation of the carrier amplifier and the peak amplifier. Further, because the driver amplifier is supported by the heat dissipation path of the first via, it is possible to provide a high-frequency amplifier having a small size and excellent heat dissipation properties.
(2) In the high-frequency amplifier according to one aspect of the present disclosure, the base member further includes an input terminal to which the high-frequency signal is input from outside, and an output terminal from which the signal amplified by the Doherty amplifier is output to the outside, the input terminal is connected to one end of a second via penetrating the base member, the first multilayer substrate, and a layer forming a portion of the second multilayer substrate and making contact with the first multilayer substrate, and the other end of the second via is connected to an input of the driver amplifier, and the output terminal is connected to one end of a third via penetrating a layer forming a portion of the first multilayer substrate and making contact with the base member, and the base member, and the other end of the third via is connected to an output of the Doherty amplifier.
The signal input to the input terminal passes through the second via, input to the second multilayer substrate without making any connection to the first multilayer substrate, and is directed through the third via toward the output terminal, thereby making it possible to provide a high-frequency amplifier having a small size and excellent heat dissipation properties.
(3) In the high-frequency amplifier according to one aspect of the present disclosure, an output of the driver amplifier is connected to one end of a fourth via penetrating a layer forming a portion of the first multilayer substrate and making contact with the second multilayer substrate, and a layer forming a portion of the second multilayer substrate and making contact with the first multilayer substrate, and the other end of the fourth via is connected to an input of the carrier amplifier and an input of the peak amplifier.

The signal from the driver amplifier is directed through the fourth via toward the output terminal, thereby making it possible to provide a high-frequency amplifier having a small size and excellent heat dissipation properties.

(4) In the high-frequency amplifier according to one aspect of the present disclosure, the Doherty amplifier further includes a branch circuit, a phase adjustment circuit, and a Doherty network, the branch circuit and the phase adjustment circuit are provided on the second multilayer substrate, and the Doherty network is provided on the first multilayer substrate.

Because the branch circuit is provided on the second multilayer substrate, it is easy to adjust the phase of the high-frequency signal from the driver amplifier to the peak amplifier or the carrier amplifier.

(5) In the high-frequency amplifier according to one aspect of the present disclosure, the peak amplifier is configured to have a saturation output greater than the carrier amplifier, and the phase adjustment circuit is provided on the second multilayer substrate between the branch circuit and the peak amplifier, and delays the phase of the input signal of the peak amplifier.

Because the phase adjustment circuit is provided on the second multilayer substrate, it is easy to adjust the phase of the high-frequency signal from the branch circuit to the peak amplifier.

(6) A high-frequency amplifier according to the present disclosure includes a first amplifier configured to amplify an input high-frequency signal; a second amplifier and a third amplifier configured to further amplify a signal output from the first amplifier; a first multilayer substrate; a second multilayer substrate laminated to overlap the first multilayer substrate; and a base member mounted with the first multilayer substrate and the second multilayer substrate, wherein the first amplifier is mounted on the second multilayer substrate, the second amplifier and the third amplifier are mounted on the first multilayer substrate, the first amplifier, the second amplifier, and the third amplifier have a front surface forming a predetermined circuit, and a back surface located on an opposite side from the front surface, respectively, the front surface of the first amplifier opposes the first multilayer substrate, and the back surface of the first amplifier is separated from the first multilayer substrate, the back surfaces of the second amplifier and the third amplifier both make contact with the base member, respectively, the back surface of the first amplifier is connected to an interconnect layer disposed on a surface of the second multilayer substrate, the interconnect layer is connected to one end of a first via penetrating the second multilayer substrate and the first multilayer substrate, and the other end of the first via is connected to the base member, and a power consumption of the first amplifier is smaller than a power consumption of each of the second amplifier and the third amplifier.

By employing a two-level structure including the first multi-layer substrate and the second multi-layer substrate, it is possible to reduce the size of the high-frequency amplifier. In addition, because the first amplifier is disposed to oppose the second amplifier and the third amplifier, the packaging density can be increased. Moreover, because the back surfaces of the second amplifier and the third amplifier which generate a large amount of heat make contact with the base member, it is possible to dissipate the heat from the second amplifier and the third amplifier. Further, because the first amplifier which generates a smaller amount of heat than the second and third amplifiers corresponds to the heat dissipation path of the first via, it possible to provide a high-frequency amplifier having a small size and excellent heat dissipation properties.

(7) In the high-frequency amplifier according to one aspect of the present disclosure, the base member further includes an input terminal to which the high-frequency signal is input from outside, and an output terminal from which the signal amplified by the second amplifier and the third amplifier is output to the outside, the input terminal is connected to one end of a second via penetrating the base member, the first multilayer substrate, and a layer forming a portion of the second multilayer substrate and making contact with the first multilayer substrate, the other end of the second via is connected to an input of the first amplifier, and the output terminal is connected to one end of a third via penetrating a layer forming a portion of the first multilayer substrate and making contact with the base member, and the other end of the third via is connected to outputs of the second amplifier and the third amplifier.

The signal input to the input terminal passes through the second via, input to the second multilayer substrate without making any connection to the first multilayer substrate, and is directed through the third via toward the output terminal, thereby making it possible to provide a high-frequency amplifier having a small size and excellent heat dissipation properties.

(8) In the high-frequency amplifier according to one aspect of the present disclosure, the output of the first amplifier is connected to one end of a fourth via penetrating a layer forming a portion of the first multilayer substrate and making contact with the second multilayer substrate, and a layer forming a portion of the second multilayer substrate and making contact with the first multilayer substrate, and the other end of the fourth via is connected to inputs of the second amplifier and the third amplifier.

Because the signal from the first amplifier is directed through the fourth via toward the output terminal, it possible to provide a high-frequency amplifier having a small size and excellent heat dissipation properties.

(9) A high-frequency amplifier according to the present disclosure includes a driver amplifier configured to amplify an input high-frequency signal; a Doherty amplifier, including a carrier amplifier and a peak amplifier, and configured to further amplify a signal output from the driver amplifier; a first multilayer substrate; a second multilayer substrate laminated to overlap the first multilayer substrate; and a base member mounted with the first multilayer substrate and the second multilayer substrate, wherein the driver amplifier is mounted on the second multilayer substrate, the carrier amplifier and the peak amplifier are mounted on the first multilayer substrate, the driver amplifier, the carrier amplifier, and the peak amplifier have a front surface forming a predetermined circuit, and a back surface located on an opposite side from the front surface, respectively, the back surface of the driver amplifier opposes the first multilayer substrate, and the front surface of the driver amplifier is separated from the first multilayer substrate, the back surfaces of the carrier amplifier and the peak amplifier both make contact with the base member, respectively, and the back surface of the driver amplifier is connected to one end of a first via penetrating a layer forming a portion of the second multilayer substrate and in contact with the first multilayer substrate, and the first multilayer substrate, and the other end of the first via is connected to the base member.

The driver amplifier and the Doherty amplifier are configured by a two-level structure including the first multilayer substrate and the second multilayer substrate. Hence, it is possible to reduce the size of the high-frequency amplifier. In addition, the packaging density can be increased because the driver amplifier is disposed to oppose the carrier amplifier and the peak amplifier. The back surfaces of the carrier amplifier and the peak amplifier are both in contact with the base member, to achieve heat dissipation of the carrier amplifier and the peak amplifier. Further, because the driver amplifier is supported by the heat dissipation path of the first via, it is possible to provide a high-frequency amplifier having a small size and excellent heat dissipation properties.

(10) A high-frequency amplifier according to the present disclosure includes a first amplifier configured to amplify an input high-frequency signal; a second amplifier and a third amplifier configured to further amplify a signal output from the first amplifier; a first multilayer substrate; a second multilayer substrate laminated to overlap the first multilayer substrate; and a base member mounted with the first multilayer substrate and the second multilayer substrate, wherein the first amplifier is mounted on the second multilayer substrate, the second amplifier and the third amplifier are mounted on the first multilayer substrate, the first amplifier, the second amplifier, and the third amplifier have a front surface forming a predetermined circuit, and a back surface located on an opposite side from the front surface, respectively, the back surface of the first amplifier opposes the first multilayer substrate, and the front surface of the first amplifier is separated from the first multilayer substrate, the back surfaces of the second amplifier and the third amplifier both make contact with the base member, respectively, the back surface of the first amplifier is connected to one end of a first via penetrating a layer forming a portion of the second multilayer substrate and in contact with the first multilayer substrate, and the first multilayer substrate, and the other end of the first via is connected to the base member, and a power consumption of the first amplifier is less than a power consumption of each of the second amplifier and the third amplifier.

By employing a two-level structure including the first multi-layer substrate and the second multi-layer substrate, it is possible to reduce the size of the high-frequency amplifier. In addition, because the first amplifier is disposed to oppose the second amplifier and the third amplifier, the packaging density can be increased. Moreover, because the back surfaces of the second amplifier and the third amplifier which generate a large amount of heat make contact with the base member, it is possible to dissipate the heat from the second amplifier and the third amplifier. Further, because the first amplifier which generates a smaller amount of heat than the second and third amplifiers corresponds to the heat dissipation path of the first via, it possible to provide a high-frequency amplifier having a small size and excellent heat dissipation properties.

Details of Embodiments of the Present Disclosure

Hereinafter, specific examples of the high-frequency amplifier according to the present disclosure will be described with reference to the accompanying drawings. FIG. 1 is a cross sectional view schematically illustrating the high-frequency amplifier according to one aspect of the present disclosure.

A high-frequency amplifier 1 is mounted in a communication device, such as a base station device or the like of a mobile communication system, and is used to amplify a transmitting signal, for example. The high-frequency amplifier 1 has a base member La4. The base member La4 is a plate made of a metal (for example, copper), which combines heat dissipation and external terminals, and is disposed on a printed circuit board 100 of the communication device.

A lower stage 10, an upper stage 20, and a lid 25 are mounted on the base member La4. The lower stage 10 corresponds to a first multilayer substrate of the present disclosure, and the upper stage 20 corresponds to a second multilayer substrate of the present disclosure.

The lower stage 10 is disposed between the base member La4 and the upper stage 20. The lower stage 10 includes a first dielectric layer 11 (having a thickness of 0.25 mm to 0.35 mm, for example), a third interconnect layer La3 (having a thickness of 18 μm to 35 μm, for example), and a second dielectric layer 12 (having a thickness of 0.8 mm to 1.0 mm, for example). The first dielectric layer 11 is provided on the base member La4 (having a thickness of 0.25 mm, for example), the third interconnect layer La3 is formed with a high-frequency line pattern in which the base member La4 forming a GND plane is set to a reference voltage, and active components, such as a carrier amplifier 54, a peak amplifier 64, or the like, an inductor L, and a capacitor C are mounted on the high-frequency line pattern.

The carrier amplifier 54 and the peak amplifier 64 have front surfaces 54a and 64a which form predetermined circuits, respectively, and back surfaces 54b and 64b which are located on the opposite sides from the front surfaces 54a and 64a and do not form circuits, for example. The carrier amplifier 54 and the peak amplifier 64 are embedded in the first dielectric layer 11, and are mounted on the third interconnect layer La3 in a state where the front surfaces 54a and 64a face upward. The back surfaces 54b and 64b are disposed to make contact with the base member La4 in a state where the back surfaces 54b and 64b face downward, and is fixed to the base member La4 which is coated with a sintered silver paste or a sintered copper paste.

The upper stage 20 is laminated to overlap the lower stage 10. The upper stage 20 includes a third dielectric layer 23 (having a thickness of 0.25 mm to 0.35 mm, for example), a first interconnect layer La1 (having a thickness of 18 μm to 35 μm, for example), and a fourth dielectric layer 24 (having a thickness of 0.25 mm to 0.35 mm, for example). A second interconnect layer La2 is disposed between the third dielectric layer 23 and the lower stage 10 (the second dielectric layer 12). The second interconnect layer La2 (having a thickness of 35 μm, for example) has a solid surface made of copper, for example, and serves as a GND plane with respect to the first interconnect layer La1, and as a shield to shield electromagnetic waves generated between and the upper stage 20 and the lower stage 10.

A high-frequency line pattern is formed in the first interconnect layer La1, and an active component, such as a driver amplifier 40 or the like, an inductor L, and a capacitors C are mounted on the high-frequency line pattern.

The driver amplifier 40 has a front surface 40a which forms a predetermined circuit, and a back surface 40b which is located on an opposite side from the front surface 40a and does not form a circuit, for example. The driver amplifier 40 is embedded in the fourth dielectric layer 24, and is mounted on the first interconnect layer La1 in a state where the front surface 40a opposes the lower stage 10. The back surface 40b is disposed so as to be separated from the lower stage 10, and faces upward.

The upper stage 20 is covered with a metal lid 25. Because the driver amplifier 40 is flip-chip mounted (face down), from a viewpoint of thermal management, the back surface 40b of the driver amplifier 40 is disposed so as to face upward and make contact with a heat sink part (a zeroth interconnect layer La0) of the lid 25. The heat sink part (the zeroth interconnect layer La0) is formed of a thin film of a metal for signal interconnect, similar to other interconnect layers. The heat sink part (the zeroth interconnect layer La0) makes contact with an adjacent GND via (having a diameter φ of 300 μm, for example) (heat dissipation vias 15d, 15c, 15b, and 15a: corresponding to a first via of the present disclosure). More particularly, the heat dissipation vias 15a through 15d penetrate the upper stage 20 and the lower stage 10, one end of this heat dissipation via is connected to the zeroth interconnect layer La0, and the other end of this heat dissipation via is connected to the base member La4. For this reason, a heat dissipation path (hereinafter referred to as a first heat dissipation path) is formed from the driver amplifier 40 to the base member La4.

An electrical path between the first interconnect layer La1 of the upper stage 20, and the third interconnect layer La3 of the lower stage 10, is secured by using signal vias 14b and 14a (corresponding to a fourth via of the present disclosure). More particularly, the signal vias 14b and 14a penetrate the third dielectric layer 23 of the upper stage 20, and the second dielectric layer 12 of the lower stage 10, one end of this signal via is connected to the first interconnect layer La1 (an output of the driver amplifier 40), and the other end of this signal via is connected to the third interconnect layer La3 (an input of the carrier amplifier 54, and an input of the peak amplifier 64).

In addition, an electrical path between the first interconnect layer La1 and the second interconnect layer La1 uses a signal via 17a which penetrates the third dielectric layer 23.

Moreover, an electrical path between the first interconnect layer La1 and the base member La4 is secured by using signal vias 13c, 13b, and 13a (corresponding to a second via of the present disclosure). More particularly, the signal vias 13a through 13c penetrate the base member La4, the lower stage 10, and the third dielectric layer 23 of the upper stage 20, one end of this signal via is connected to an input terminal RFin, and the other end of this signal via is connected to the first interconnect layer La1 (an input of the driver amplifier 40). On the other hand, an electrical path between the third interconnect layer La3 and the base member La4 is secured using a signal via 16a (corresponding to a third via of the present disclosure). More particularly, the signal via 16a penetrates the first dielectric layer 11 of the lower stage 10, and the base member La4, one end of this signal via is connected to an output terminal RFout, and the other end of this signal via is connected to the third interconnect layer La3 (an output of a Doherty amplifier 50).

Because the upper stage 20 is laminated to overlap the lower stage 10, and the driver amplifier 40, the carrier amplifier 54, and the peak amplifier 64 are mounted three dimensionally, it is possible to reduce the outer size of the high-frequency amplifier 1 to a module size such as the size of 6 mm square with a thickness of 2.2 mm.

Further, the high-frequency amplifier 1 does not require a wire-bonding connection. Accordingly, a large panel having a size of 500 mm square, for example, can be supplied to a manufacturing process, and because 6000 modules having the size of 6 mm square can be obtained from the panel, for example, it is possible to greatly reduce the cost caused by processing cost and material cost.

Figure 3:
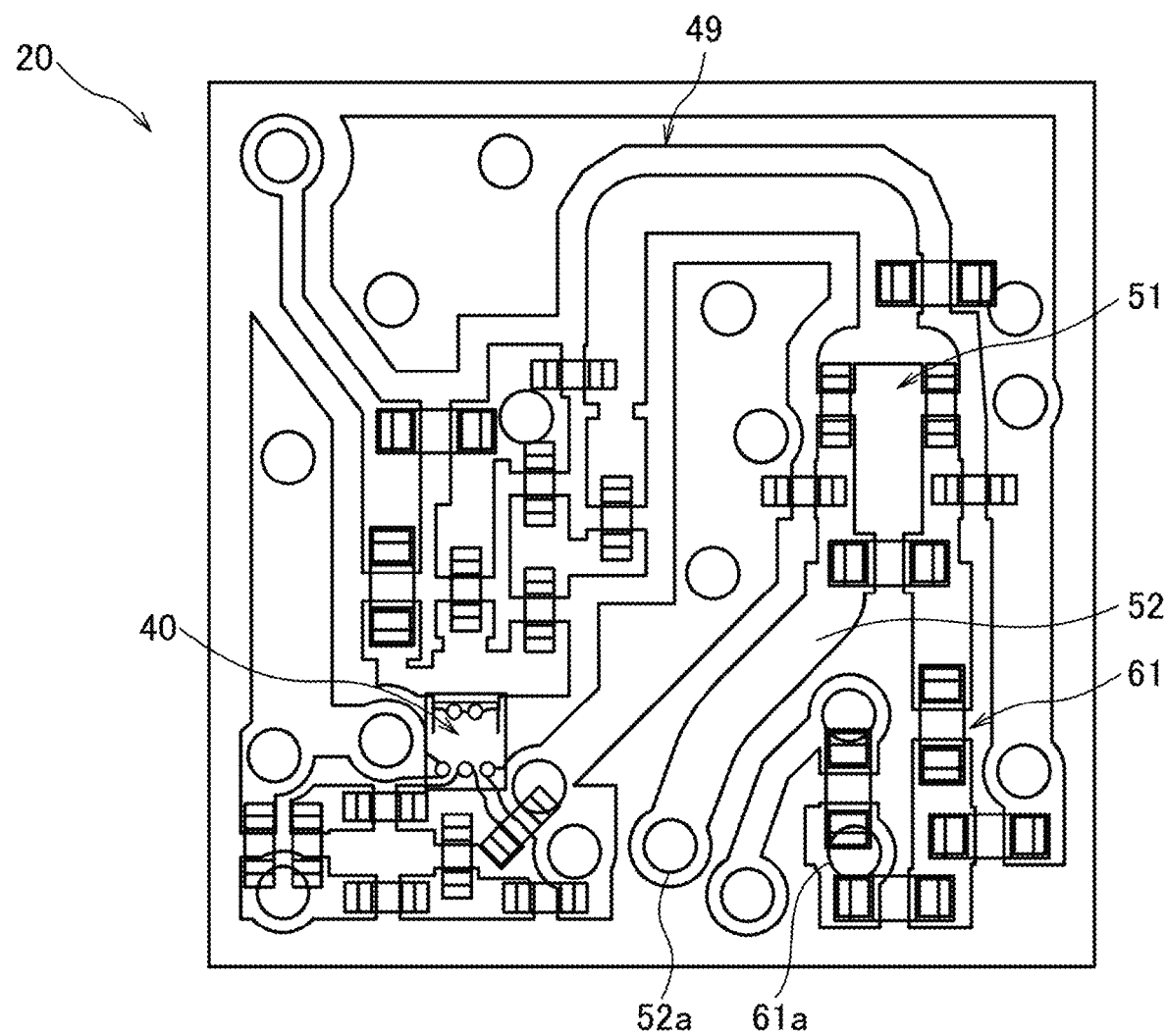
FIG. 3 is a plan view of an upper state of FIG. 1.
Figure 4:
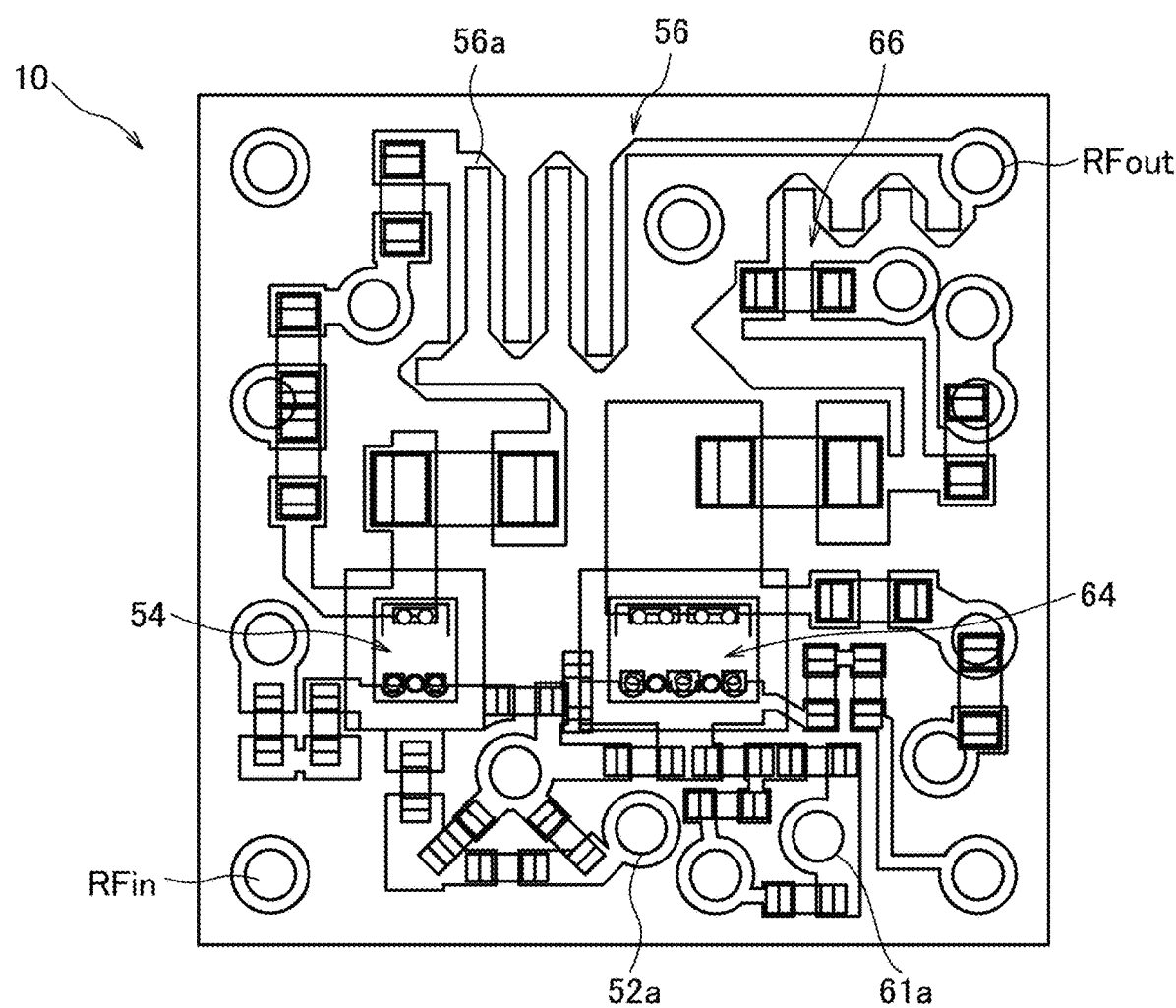
FIG. 4 is a plan view of a lower stage of FIG. 1.

When the upper stage 20 described in conjunction with FIG. 3 is laminated to overlap the lower stage 10 described in conjunction with FIG. 4, the input terminal of the driver amplifier 40 and the input terminal of the carrier amplifier 54 oppose each other in the up and down directions, and a distance between the input terminal of the driver amplifier 40 and the input terminal of the carrier amplifier 54 becomes 1 mm or less in the up and down directions, for example, and the distance may be significantly reduced compared to the case where the driver amplifier 40 and the carrier amplifier 54 are disposed on the same plane. According to such a physical arrangement, when a phase error between two input signals falls within a range of $\pm\pi/2$, an interference is generated between the two input signals, thereby causing an unstable operation of the driver amplifier 40. More particularly, the output signal of driver amplifier 40 may be fed back to the input, and cause an oscillation of the driver amplifier 40.

Accordingly, in the high-frequency amplifier 1, an electrical length between the input terminal of the driver amplifier 40 and the output terminal of the carrier amplifier 54, that is, an electrical length which takes into account the chip components in addition to an interconnection length, or a delay time of an input signal having a wavelength $\lambda$ transmitted from the input terminal of the driver amplifier 40 to the output terminal of the carrier amplifier 54, including the intermediate chip components, is converted into a phase of the input signal having the wavelength $\lambda$, so that the phase is set to $(2n+1)\times\pi$ between the terminals, where n is an integer greater than or equal to 0.

In order to achieve the above, in a path from a drain output of the driver amplifier 40 to a branch circuit 51, the path is greatly diverted from a center toward a right half of the upper stage 20 as indicated by a curved pattern 49 illustrated in FIG. 3 or, in a path from an output of the branch circuit 51 to a via 52a, the path is curved as indicated by a curved pattern 52 illustrated in FIG. 3 rather than linear, for example.

Accordingly, the electrical length from the input terminal of the driver amplifier 40 to the output terminal of the carrier amplifier 54 is set so that the phase is $(2n+1)\times\pi$. For this reason, even if a signal feedback occurs, that is, a portion of the output signal is fed back from the output of the carrier amplifier 54 to the input of the driver amplifier 40, the phase is set within a range in which the driver amplifier 40 will not become unstable. In other words, the phase is set in a negative feedback region, and not to $2n\pi$, that is, not in a positive feedback region which causes instability. Hence, it is possible to stabilize the amplifier 1 even when the two-level structure is employed.

Furthermore, in a general Doherty amplifier, the phase error between a carrier amplifier and a peak amplifier is set to $\pi/2$, while in the high-frequency amplifier 1, this phase error is set to n. In other words, the phase error between an RF signal at the output terminal of the carrier amplifier 54 and an RF signal at the output terminal of the peak amplifier 64 is in the range of $\pi/2$ to $3\pi/2$.

Hence, because electromagnetic waves emitted from the carrier amplifier 54 and electromagnetic waves emitted from the peak amplifier 64 cancel each other nearby, electromagnetic waves emitted to the outside of the high-frequency amplifier 1 can be reduced to a small value.

The phase of the carrier amplifier 54 and the phase of the peak amplifier 64 are synchronized at an output terminal RFout by a phase adjustment circuit 61 which will be described in conjunction with FIG. 3, input matching circuits 53 and 63, output matching circuits 55 and 65, and a transmission line TRL1 (90° transmission line 56a which will be described in conjunction with FIG. 4) which will be described in conjunction with FIG. 7 and FIG. 8.

Figure 2:
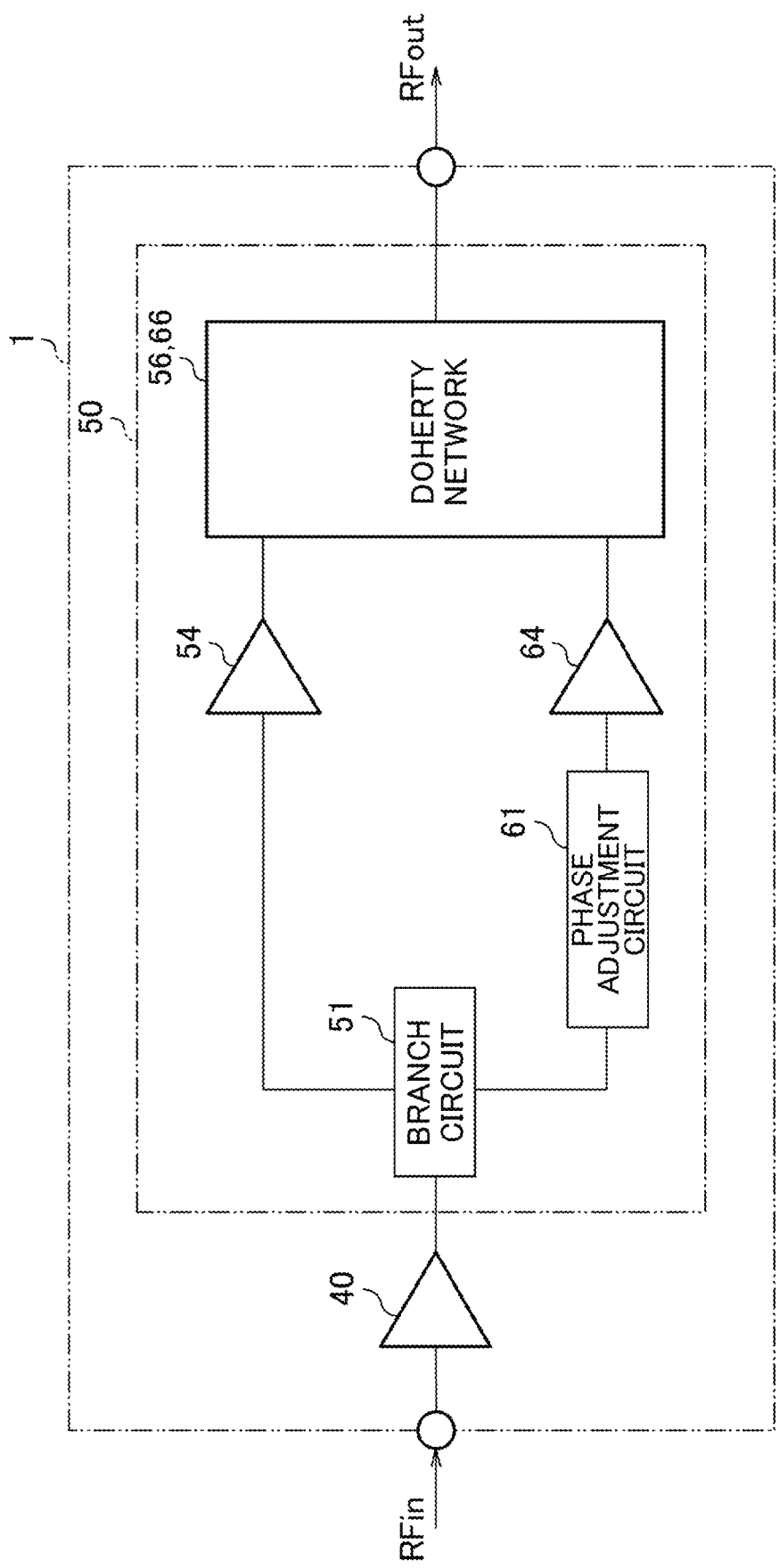
FIG. 2 is a block diagram for explaining the high-frequency amplifier of FIG. 1.

FIG. 2 is a block diagram illustrating the high-frequency amplifier of FIG. 1. FIG. 3 is a plan view of the upper stage of FIG. 1, and FIG. 4 is a plan view of the lower stage of FIG. 1.

The high-frequency amplifier 1 includes the driver amplifier 40, and the Doherty amplifier 50 provided at a stage subsequent to the driver amplifier 40, and is configured to be able to amplify a signal in a frequency band of 5 GHz to 6 GHz, for example.

The driver amplifier 40 amplifies the Radio Frequency (RF) signal prescribed by the wavelength λ and input to the input terminal Rfin, to such an extent that the Doherty amplifier 50 can amplify the signal to a predetermined transmission power.

The Doherty amplifier 50 includes the branch circuit 51, the phase adjustment circuit 61, the carrier amplifier 54, the peak amplifier 64, and Doherty networks 56 and 66, and further amplifies the RF signal amplified by the driver amplifier 40 to output the further amplified RF signal from the output terminal RFout.

The driver amplifier 40, the carrier amplifier 54, and the peak amplifier 64 are amplifiers using a High Electron Mobility Transistor (GaN-HEMT) as an amplifier element, for example. The driver amplifier 40, the carrier amplifier 54, and the peak amplifier 64 are respectively have a gate pad provided on one side of a rectangular shape, and a drain pad provided on a side opposing the gate pad.

The driver amplifier 40, the carrier amplifier 54, and the peak amplifier 64 respectively have source pads provided on both sides of the gate pad. However, the two source pads of the driver amplifier 40 are connected to the GND formed in upper stage 20. On the other hand, the source pads of the carrier amplifier 54 and the peak amplifier 64 are connected to the base member La4 through the back surfaces 54b and 64b described in conjunction with FIG. 1. Accordingly, the GND is secured, and a heat dissipation path (hereinafter referred to as a second heat dissipation path) is formed from the carrier amplifier 54 and the peak amplifier 64, respectively, to the base member La4.

The second heat dissipation path may be regarded as having superior heat dissipation properties compared to the first heat dissipation path. In the second heat dissipation path, the source pads of the carrier amplifier 54 and the peak amplifier 64 are connected to the base member La4 through the back surfaces 54b and 64b, respectively. The base member La4 is a plate made of a metal (for example, copper), and has excellent heat dissipation properties. On the other hand, in the first heat dissipation path, the source pad of the driver amplifier 40 is connected to the heat sink part (the zeroth interconnect layer La0) through the back surface 40b, and is connected to the base member La4 through an adjacent GND via. Because the zeroth interconnect layer La0 is formed of a thin film of a metal for signal interconnect, from the viewpoint of heat dissipation efficiency, the zeroth interconnect layer La0 is not as good as the base member La4 which is the plate made of the metal (for example, copper). As a result, because this heat sink part (the zeroth interconnect layer La0) limits the rate of heat conduction, the second heat dissipation path may be regarded as having superior heat dissipation properties compared to the first heat dissipation path.

With regard to the first heat dissipation path, it may be regarded that the heat dissipation efficiency of the first heat dissipation path can be improved by further increasing a diameter of the heat dissipation vias 15a, 15b, 15c, and 15d, and providing heat dissipation vias in parallel with the existing heat dissipation path (the first heat dissipation path) in a heat dissipation path connecting the heat sink part (the zeroth interconnect layer La0) and the base member La4.

The upper stage 20 illustrated in FIG. 3 and the lower stage 10 illustrated in FIG. 4 have approximately similar figures in the plan view, and both stages have a square shape with a side of 6 mm, for example.

As illustrated in FIG. 1, the RF signal input to an input terminal RFin (the signal via 13a) through a signal interconnect 101a provided on the printed circuit board 100 of the communication device, passes through the signal vias 13a, 13b, and 13c illustrated in FIG. 1 which penetrate the lower stage 10 from the base member La4 illustrated in FIG. 1, and is input to a lower left corner portion of the upper stage 20 illustrated in FIG. 3, without being connected to any portion of the lower stage 10. The driver amplifier 40 is mounted near the lower left of the upper stage 20, and the RF signal amplified by the driver amplifier 40 turns greatly as illustrated by the curved pattern 49 in FIG. 3. More particularly, in the view of FIG. 3, the amplified RF signal travels toward the upper side of the upper stage 20, turns right toward the left along this upper side, turns further right toward the lower side of the upper stage 20, and reaches the branch circuit 51 provided in the same upper stage 20 as the driver amplifier 40.

The branch circuit 51 is a Wilkinson distributor which equally divides the RF signal amplified by the driver amplifier 40 to an input path on the side of the peak amplifier and an input path on the side of the carrier amplifier.

One of the RF signals (the input path on the side of the carrier amplifier) divided by the branch circuit 51, passes through the predetermined curved pattern 52, and travels toward the lower stage 10 from the via 52a formed near the lower side of the upper stage 20 in the view of FIG. 3. This path may be similar to the signal path through the signal vias 14a and 14b illustrated in FIG. 1, for example. On the other hand, the other of the RF signals (the input path on the side of the peak amplifier) divided by the branch circuit 51 reaches the phase adjustment circuit 61 provided in the same upper stage 20 as the driver amplifier 40.

The phase adjustment circuit 61 delays the phase of the input signal of the peak amplifier 64 by a predetermined distributed constant. For example, the input signal is delayed by 90°. The RF signal passed through the phase adjustment circuit 61 is directed toward the lower stage 10 from the via 61a formed near the lower side of the upper stage 20 in the view of FIG. 3. The RF signal also passes through a path similar to the signal path through signal vias 14a and 14b illustrated in FIG. 1.

In this embodiment, the phase adjustment circuit 61 is not disposed between the branch circuit 51 and the carrier amplifier 54, and is disposed between the branch circuit 51 and the peak amplifier 64 in this example. However, the present disclosure is not limited to this example. For example, in place of disposing the phase adjustment circuit between the branch circuit 51 and the peak amplifier 64, the phase adjustment circuit may be disposed between the branch circuit 51 and the carrier amplifier 54, so as to delay the phase of the input signal of the carrier amplifier 54.

The Doherty amplifier 50 in this embodiment is an asymmetric Doherty amplifier, and the peak amplifier 64 and the carrier amplifier 54 exhibit different maximum output intensities with respect to the input RF signal. For example, the peak amplifier 64 has a saturation output (size) approximately two times larger than the carrier amplifier 54, and the peak amplifier 64 starts an amplification operation when the output of the carrier amplifier 54 reaches the saturation region. More particularly, the carrier amplifier 54 operates as a class AB amplifier or a class B amplifier. The peak amplifier 64 operates as a class C amplifier. When an instantaneous power is low, the carrier amplifier 54 operates, and the peak amplifier 64 is not operated, thereby increasing the power efficiency. When the instantaneous power is high, both the carrier amplifier 54 and the peak amplifier 64 operate, thereby enabling the saturation power to become high while maintaining high power efficiency.

As an example, output examples of the driver amplifier 40, the carrier amplifier 54, and the peak amplifier 64 will be described. The driver amplifier 40 has an output of 10 W, the carrier amplifier 54 has an output of 15 W, and the peak amplifier 64 has an output of 30 W. The 10 W output principally represents the size of the FET, and means that the FET size is sufficient to provide the 10 W output, but does not necessarily always provide the 10 W output.

The RF signal amplified by the carrier amplifier 54 reaches the Doherty network 56 on the side of the carrier amplifier provided in the lower stage 10. The Doherty network 56 is provided with a 90° transmission line (also referred to as a λ/4 line) 56a. For this reason, the RF signal amplified by the carrier amplifier 54 is combined with the output signal of the peak amplifier 64 which will be described later, through the 90° transmission line 56a, and output from the output terminal RFout provided at the upper right corner portion of the lower stage 10 in the view of FIG. 4.

On the other hand, the RF signal amplified by the peak amplifier 64 reaches the Doherty network 66 on the side of the peak amplifier provided in the lower stage 10, is combined with the output signal of the carrier amplifier 54, passes through a signal path passing through the signal via 16a illustrated in FIG. 1, and output from the output terminal RFout. The signal output from the output terminal RFout is transmitted to the outside of the high-frequency amplifier 1, through a signal interconnect 101b provided on the printed circuit board 100 of the communication device illustrated in FIG. 1. The Doherty network 56 on the side of the carrier amplifier, and the Doherty network 66 on the side of the peak amplifier, correspond to a Doherty network according to the present disclosure.

Figure 5:
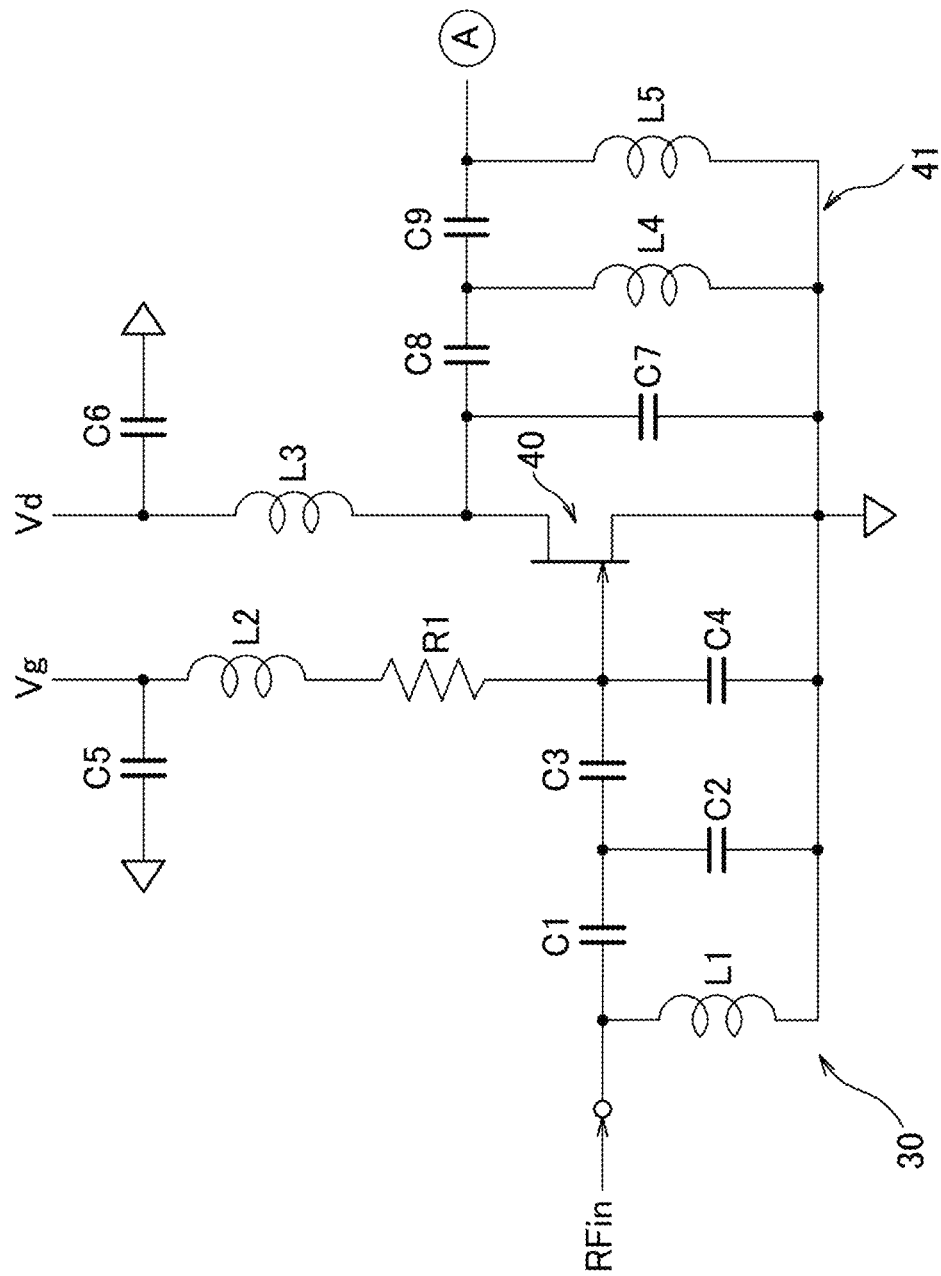
FIG. 5 is a circuit diagram of a driver amplifier circuit.
Figure 6:
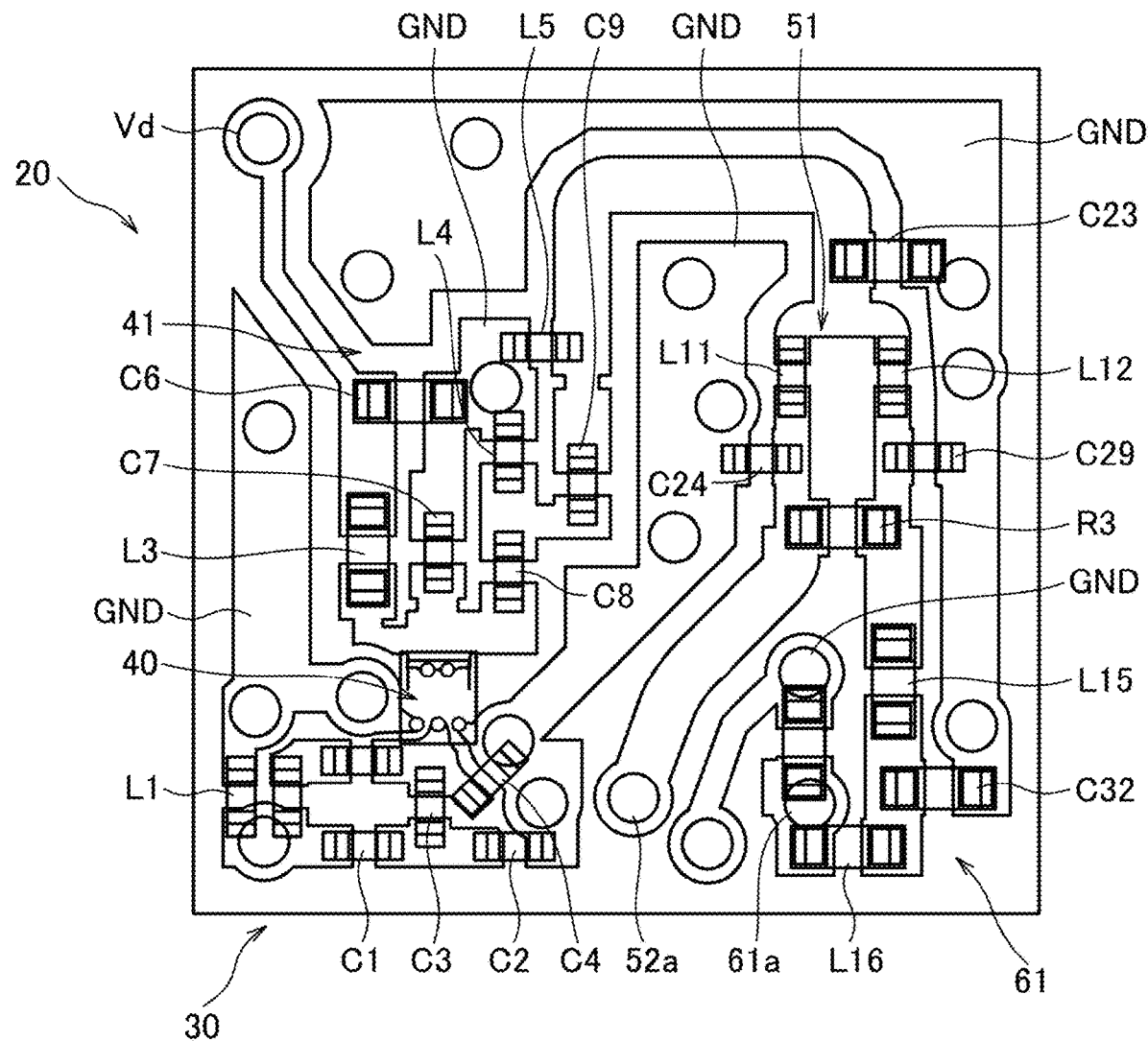
FIG. 6 is a diagram for explaining the upper stage in correspondence with the circuit diagram of FIG. 5.

FIG. 5 is a circuit diagram of the driver amplifier of FIG. 1, and FIG. 6 is a diagram for explaining the upper stage in correspondence with the circuit diagram of FIG. 5. In addition, FIG. 7 is a circuit diagram of the Doherty amplifier circuit of FIG. 1, and FIG. 8 is a diagram for explaining the lower stage in correspondence with the circuit diagram of FIG. 7.

The RF signal input from the input terminal RFin illustrated in FIG. 5 is input to a gate of the driver amplifier 40 through an input matching circuit 30 (total of five elements including an inductor L1, and capacitors C1 through C4). A gate bias is supplied from a power supply Vg through an inductor L2. A capacitor C5 is a bypass capacitor of power supply Vg, and a resistor R1 is a tuning resistor.

A drain output of the driver amplifier 40 is supplied to branch circuit 51 through an output matching circuit 41 (inductors L4 and L5, capacitors C7 through C9). A drain bias is supplied from a power supply Vd through an inductor L3. A capacitor C6 is a bypass capacitor of power supply Vd.

Figure 7:
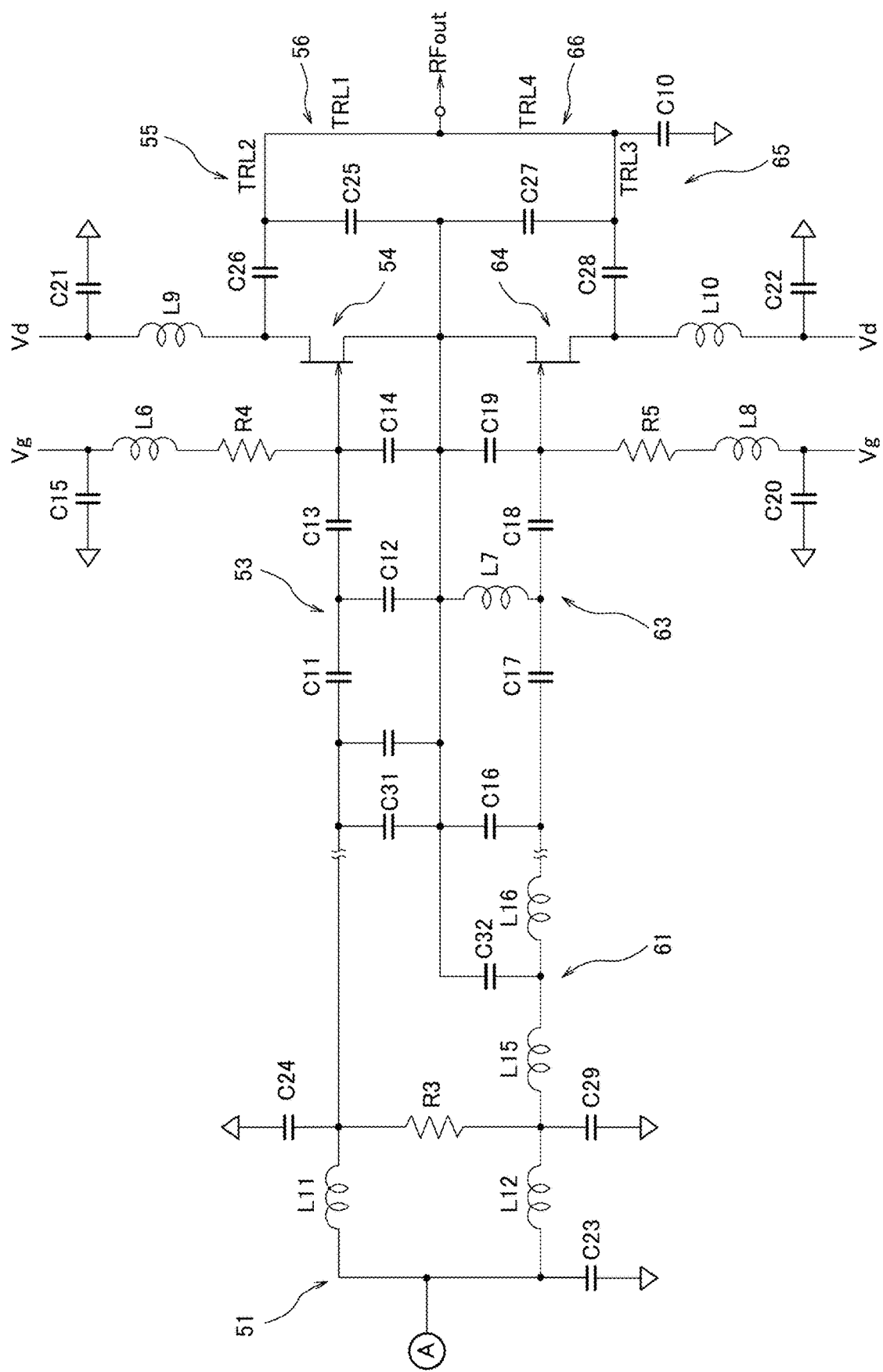
FIG. 7 is a circuit diagram of a Doherty amplifier.
Figure 8:
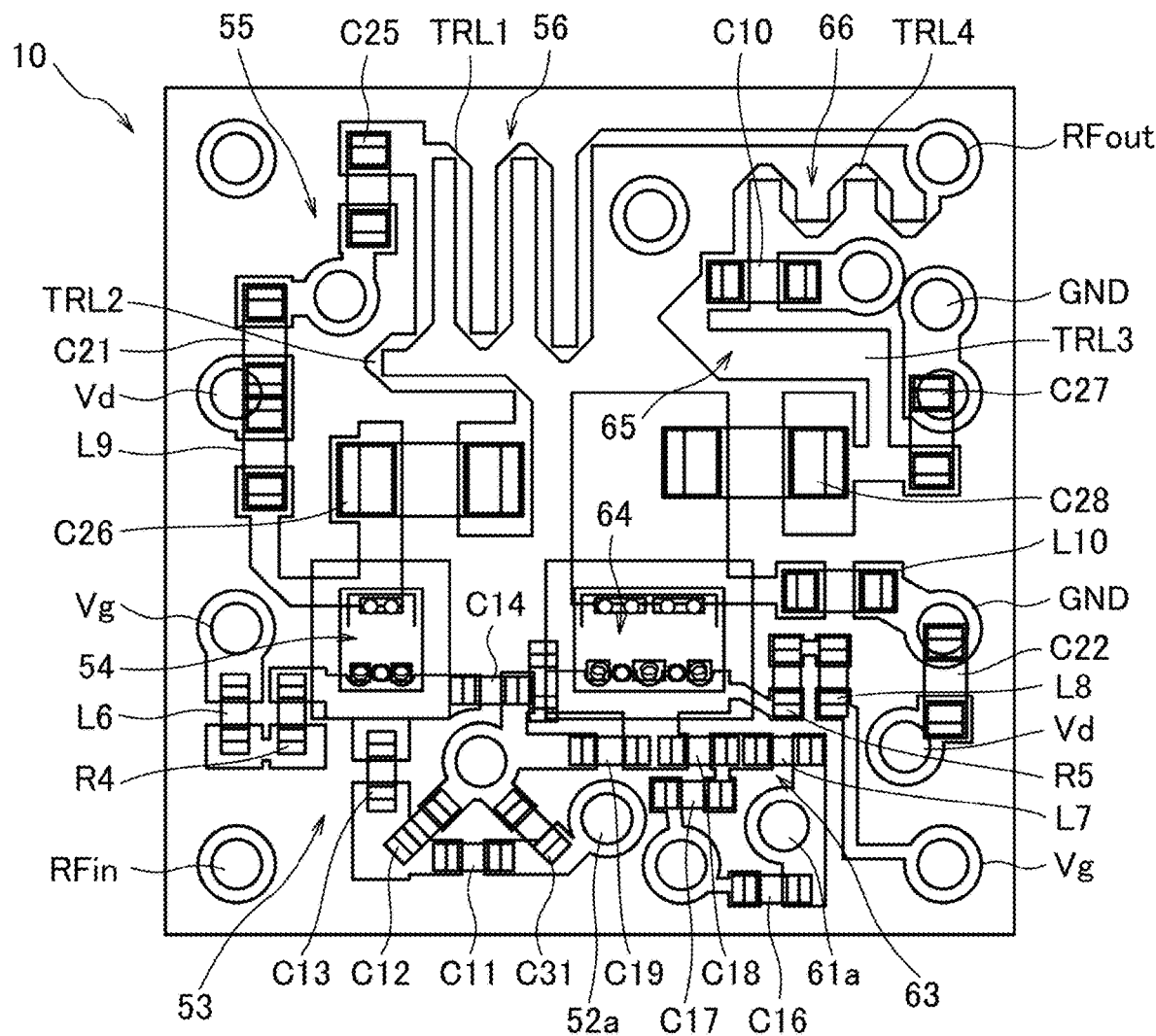
FIG. 8 is a diagram for explaining the lower stage in correspondence with the circuit diagram of FIG. 7.

Next, as illustrated in FIG. 7, in the branch circuit 51, the RF signal from the driver amplifier 40 is equally divided to a matching circuit of L11 and C24, and a matching circuit of C23, L12, and C29.

The RF signal phase-adjusted by the matching circuit of L11 and C24 reaches the lower stage 10 through the curved pattern 52 and the via 52a described in conjunction with FIG. 3, and is directed toward the carrier amplifier 54. The RF signal reaching the lower stage 10 is input to a gate of the carrier amplifier 54 through an input matching circuit 53 (capacitors C31, and C11 through C14). A gate bias is supplied from the power supply Vg through an inductor L6. A capacitor C15 is a bypass capacitor of power supply Vg, and a resistor R4 is a tuning resistor.

A drain output of the carrier amplifier 54 is supplied to the Doherty network 56 on the side of the carrier amplifier through a capacitor C26 for cutting of the DC component. A drain bias is supplied from the power supply Vd through an inductor L9. A capacitor C21 is a bypass capacitor of the power supply Vd.

The Doherty network 56 on the side of the carrier amplifier is configured to include an output matching circuit 55 including a transmission line TRL2 and a capacitor C25, and a transmission line TRL1 (including the 90° transmission line 56a described in conjunction with FIG. 4) for combining the output of the carrier amplifier 54 and the output of the peak amplifier 64.

On the other hand, the RF signal, which is equally divided by the branch circuit 51 and is phase-adjusted by the matching circuit of C23, L12, and C29, is further phase-adjusted by the phase adjustment circuit 61 (inductors L15 and L16, and a capacitor C32), reaches the lower stage 10 through the via 61a, and is directed toward the peak amplifier 64.

The RF signal reaching the lower stage 10 is input to a gate of the peak amplifier 64 through the input matching circuit 63 (inductor L7, and capacitors C16 through C19). A gate bias is supplied from the power supply Vg through an inductor L8. A capacitor C20 is a bypass capacitor of the power supply Vg, and a resistor R5 is a tuning resistor.

A drain output of the peak amplifier 64 is supplied to the Doherty network 66 on the side of the peak amplifier, through a capacitor C28 for cutting off the DC component. A drain bias is supplied from the power supply Vd through an inductor L10. A capacitor C22 is a bypass capacitor of the power supply Vd.

The Doherty network 66 on the side of the peak amplifier is configured to include a two-stage configuration of the capacitor C27 and the capacitor C10, the output matching circuit 65 including a transmission line TRL3, and a transmission line TRL4.

Compared to the amplifier output described above, the respective current consumption or power consumption, and the resulting magnitude of the heat generation, are expected to be largest for the peak amplifier 64, followed by the carrier amplifier 54 and the driver amplifier 40 in this order. In the high-frequency amplifier 1 according to the present embodiment, the peak amplifier 64 and the carrier amplifier 54, which generate more heat, are supported by the second heat dissipation paths having a higher heat dissipation efficiency, and the driver amplifier 40, which generates less heat, is supported by the first heat dissipation path. According to this configuration, the high-frequency amplifier 1 can provide a high-frequency amplifier having a small size and excellent heat dissipation properties.

In the high-frequency amplifier 1, in order to support the peak amplifier 64 and the carrier amplifier 54 by the second heat dissipation paths, and support the driver amplifier 40 by the first heat dissipation path, as illustrated in FIG. 1, the RF signal input to the input terminal RFin (signal via 13a) penetrates the lower stage 10 from the base member La4, passes through the signal vias 13a, 13b, and 13c illustrated in FIG. 1, and is input to the lower left corner portion of the upper stage 20 in the view of FIG. 3 without being connected to any portion of the lower stage 10. In addition, because the RF signal divided by the branch circuit 51 is input to the peak amplifier 64 and the carrier amplifier 54 provided in the lower stage 10, the RF signal passes through a path similar to the signal path through the signal vias 14a and 14b illustrated in FIG. 1. By passing the RF signal through these signal paths, the high-frequency amplifier 1 can provide a high-frequency amplifier having a small size and excellent heat dissipation properties.

The embodiments disclosed herein are to be considered illustrative in all respects and not restrictive. The scope of the present disclosure is not limited to the configuration of the embodiments described above, and as presented in the appended claims, includes all variations within the meaning and scope of the claims and equivalents thereof.

Moreover, when manufacturing the high-frequency amplifier 1 described in conjunction with FIG. 1, the layers can be grown in both directions with reference to the front surface and the back surface of the second dielectric layer 12 of the lower stage 10, for example. More particularly, the second interconnect layer La2, the third dielectric layer 23, the first interconnect layer La1, and the fourth dielectric layer 24 of the upper stage 20 can be provided in this order on one surface (the front surface) of the second dielectric layer 12 of the lower stage 10 described in conjunction with FIG. 1. On the other hand, the third interconnect layer La1 of the lower stage 10, and the first dielectric layer 11 can be provided in this order on the other surface (the back surface) of the second dielectric layer 12 of the lower stage 10. However, the present disclosure is not limited to this example, and for example, the layers may be grown in only one direction on the front surface or the back surface.

Figure 9:
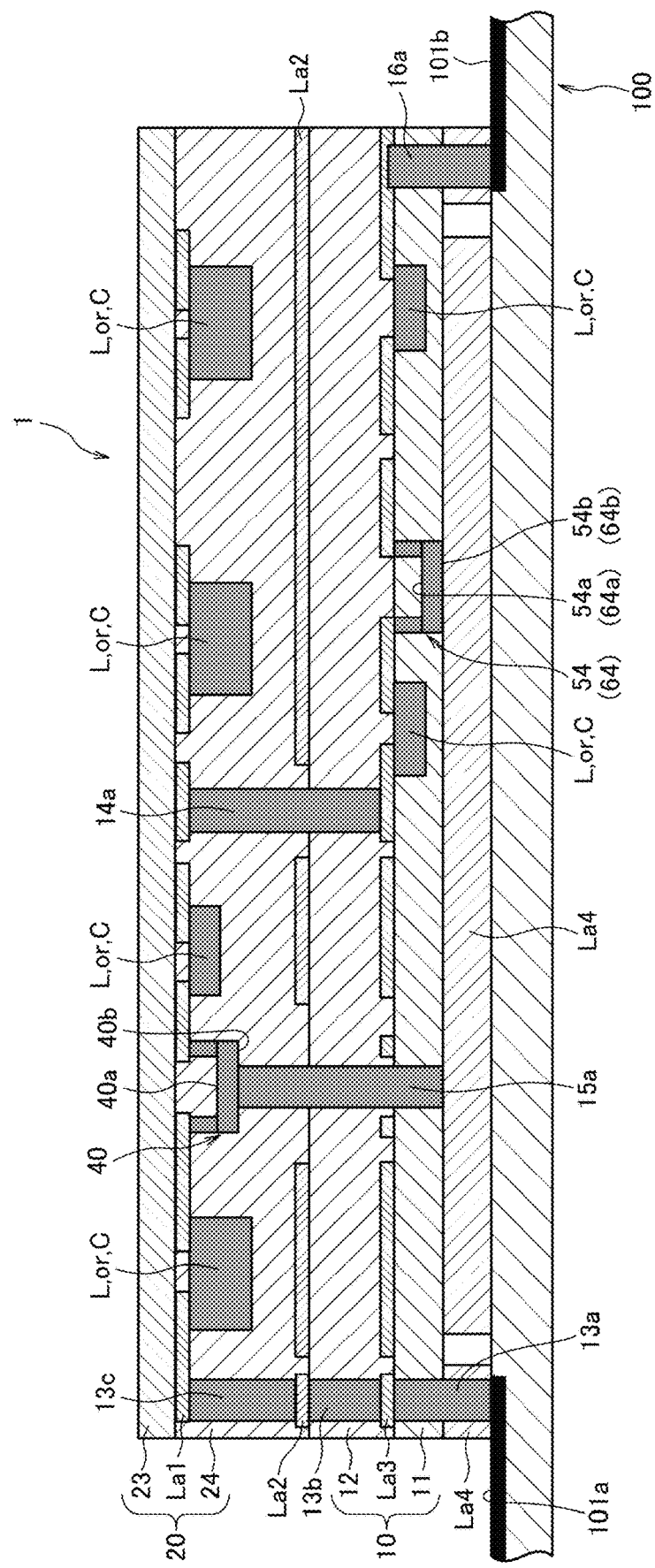
FIG. 9 is a cross sectional view schematically illustrating the high-frequency amplifier according to another aspect of the present disclosure.

FIG. 9 is a schematic cross sectional view of the high-frequency amplifier according to another aspect of the present disclosure. Constituent elements having the same functions as the high-frequency amplifier 1 illustrated in FIG. 1 are designated by the same reference numerals, and a detailed description thereof will be omitted.

The high-frequency amplifier 1 illustrated in FIG. 9 also includes the base member La4, and the lower stage 10 and the upper stage 20 are mounted on the base member La4. No lid is mounted on this high-frequency amplifier 1.

The upper stage 20 includes the fourth dielectric layer 24 (having a thickness of 0.4 mm, for example), the first interconnect layer La1 (having a thickness of 10 μm to 35 μm, for example), and the third dielectric layer 23 (having a thickness of 0.1 mm, for example). The third dielectric layer 23 is thin compared to the third dielectric layer 23 described in conjunction with FIG. 1. When manufacturing the high-frequency amplifier 1, the first interconnect layer La1 is first provided on one surface of the third dielectric layer 23. Next, an active component such as the driver amplifier 40 or the like, the inductor L, and the capacitor C are mounted on one surface of the first interconnect layer La1, and the fourth dielectric layer 24 is disposed thereafter.

The driver amplifier 40 is provided on the fourth dielectric layer 24, and is mounted on one surface of the first interconnect layer La1 and disposed so that the front surface 40a of the driver amplifier 40 is separated from the lower stage 10. The back surface 40b of the driver amplifier 40 is disposed to oppose the lower stage 10.

The second interconnect layer La2 (having a thickness of 10 μm to 35 μm, for example) is disposed between the fourth dielectric layer 24 and the lower stage 10 (the second dielectric layer 12). The second interconnect layer La2 serves as a GND plane with respect to the first interconnect layer La1.

The lower stage 10 includes the first dielectric layer 11 (having a thickness of 0.28 mm, for example), the third interconnect layer La1 (having a thickness of 10 μm to 35 μm, for example), and the second dielectric layer 12 (having a thickness of 0.2 mm, for example). The second dielectric layer 12 is thin compared to the second dielectric layer 12 described in conjunction with FIG. 1. When manufacturing the high-frequency amplifier 1, the second dielectric layer 12 is disposed on one surface of the second interconnect layer La2, and the third interconnect layer La3 is disposed on one surface of this second dielectric layer 12. Next, active components such as the carrier amplifier 54 and the peak amplifier 64, the inductor L, and the capacitor C are mounted to one surface of the third interconnect layer La3, and the first dielectric layer 11 is disposed thereafter.

The carrier amplifier 54 and the peak amplifier 64 are provided on the first dielectric layer 11, and are mounted on one surface of the third interconnect layer La3 in a state where both the front surfaces 54a and 64a face upward. The back surfaces 54b and 64b are both disposed to face downward and make contact with the base member La4, and are fixed to the base member La4 coated with a sintered silver paste or a sintered copper paste.

The base member La4 (having a thickness of 0.15 mm to 0.25 mm, for example), which forms the GND plane, is disposed on one surface of the first dielectric layer 11.

Further, as illustrated in FIG. 9, the back surface 40b of the driver amplifier 40 is in contact with the heat dissipation via 15a (corresponding to the first via of the present disclosure). More particularly, the heat dissipation via 15a is a layer of a portion of the upper stage 20, making contact with the lower stage 10, and penetrates the fourth dielectric layer 24 and the lower stage 10. One end of the heat dissipation via 15a is connected to the back surface 40b of the driver amplifier 40, and the other end of the heat dissipation via 15a is connected to the base member La4. For this reason, a third heat dissipation path, which functions similar to FIG. 1, is formed from the driver amplifier 40 to the base member La4. Although the first heat dissipation path illustrated in FIG. 1 is connected to the heat sink portion (the zeroth interconnect layer La0), and is connected to the base member La4 through the adjacent GND via, in the third heat dissipation path illustrated in FIG. 9, the back surface 40b of the driver amplifier 40 is directly connected to one end of the heat dissipating via, and not through an interconnect layer corresponding to the heat sink portion of FIG. 1. For this reason, the third heat dissipation path in FIG. 9 may be regarded as having superior heat dissipation properties than the first heat dissipation path in FIG. 1.

Similar to FIG. 1, the electrical path between the first interconnect layer La1 of the upper stage 20 and the third interconnect layer La3 of the lower stage 10 is secured using the signal via 14a.

In addition, the electrical paths between the first interconnect layer La1 and the base member La4 are secured using the signal vias 13a through 13c, respectively. On the other hand, the electrical path between the third interconnect layer La3 and the base member La4 is secured using the signal via 16a.

DESCRIPTION OF REFERENCE NUMERALS

1 . . . RF amplifier, 10 . . . lower stage, 11 . . . first dielectric layer, 12 . . . second dielectric layer, 13a, 13b, 13c, 14a, 14a, 17a . . . signal via, 15a, 15b, 15c, 15d . . . heat dissipating via, 20 . . . upper stage, 23 . . . third dielectric layer, 24 . . . fourth dielectric layer, 25 . . . lid, 30 . . . input matching circuit, 40 . . . driver amplifier, 40a . . . front surface, 40b . . . back surface, 41 . . . output matching circuit, 49 . . . curved pattern, 50 . . . Doherty amplifier, 51 . . . branch circuit, 52 . . . curved pattern, 52a . . . via, 53 . . . input matching circuit, 54 . . . carrier amplifier 54a . . . front surface, 54b . . . back surface, 55 . . . output matching circuit, 56, 66 . . . Doherty network, 61 . . . phase adjustment circuit, 61a . . . via, 64 . . . peak amplifier 64a . . . front surface, 64b . . . back surface, 65 . . . output matching circuit, 100 . . . printed circuit board, 101a, 101b . . . wiring on printed circuit board, La0 . . . zeroth interconnect layer (heat sink portion), La1 . . . first interconnect layer, La2 . . . second interconnect layer, La3 . . . third interconnect layer, La4 . . . base member, RFin . . . input terminal, RFout . . . output terminal, L, L1-L12, L15, L16 . . . inductor, C, C1-C29, C31, C32 . . . capacitor, R1, R3-R5 . . . resistor, TRL1-TRL4 . . . transmission line, Vd, Vg . . . power supply.

The invention claimed is:

1. A high-frequency amplifier comprising:
a driver amplifier configured to amplify an input high-frequency signal;
a Doherty amplifier, including a carrier amplifier and a peak amplifier, and configured to further amplify a signal output from the driver amplifier;
a first multilayer substrate;
a second multilayer substrate laminated to overlap the first multilayer substrate; and
a base member mounted with the first multilayer substrate and the second multilayer substrate, wherein
the driver amplifier is mounted on the second multilayer substrate,
the carrier amplifier and the peak amplifier are mounted on the first multilayer substrate,
the driver amplifier, the carrier amplifier, and the peak amplifier have a front surface forming a predetermined circuit, and a back surface located on an opposite side from the front surface, respectively,
the front surface of the driver amplifier opposes the first multilayer substrate, and the back surface of the driver amplifier is separated from the first multilayer substrate,
the back surfaces of the carrier amplifier and the peak amplifier both make contact with the base member, respectively, and
the back surface of the driver amplifier is connected to a first interconnect layer disposed on a surface of the second multilayer substrate, the first interconnect layer is connected to one end of a first via penetrating the second multilayer substrate and the first multilayer substrate, and the other end of the first via is connected to the base member.

2. The high-frequency amplifier as claimed in claim 1, wherein
the base member further includes an input terminal to which the high-frequency signal is input from outside, and an output terminal from which the signal amplified by the Doherty amplifier is output to the outside,
the input terminal is connected to one end of a second via penetrating the base member, the first multilayer substrate, and a layer forming a portion of the second multilayer substrate and making contact with the first multilayer substrate, and the other end of the second via is connected to an input of the driver amplifier, and
the output terminal is connected to one end of a third via penetrating a layer forming a portion of the first multilayer substrate and making contact with the base member, and the base member, and the other end of the third via is connected to an output of the Doherty amplifier.

3. The high-frequency amplifier as claimed in claim 2, wherein an output of the driver amplifier is connected to one end of a fourth via penetrating a layer forming a portion of the first multilayer substrate and making contact with the second multilayer substrate, and a layer forming a portion of the second multilayer substrate and making contact with the first multilayer substrate, and the other end of the fourth via is connected to an input of the carrier amplifier and an input of the peak amplifier.

4. The high-frequency amplifier as claimed in claim 3, wherein
the Doherty amplifier further includes a branch circuit, a phase adjustment circuit, and a Doherty network,
the branch circuit and the phase adjustment circuit are provided on the second multilayer substrate, and
the Doherty network is provided on the first multilayer substrate.

5. The high-frequency amplifier as claimed in claim 4, wherein
the peak amplifier is configured to have a saturation output greater than the carrier amplifier, and
the phase adjustment circuit is provided on the second multilayer substrate between the branch circuit and the peak amplifier, and delays the phase of the input signal of the peak amplifier.

6. A high-frequency amplifier comprising:
a first amplifier configured to amplify an input high-frequency signal;
a second amplifier and a third amplifier configured to further amplify a signal output from the first amplifier;
a first multilayer substrate;
a second multilayer substrate laminated to overlap the first multilayer substrate; and
a base member mounted with the first multilayer substrate and the second multilayer substrate, wherein
the first amplifier is mounted on the second multilayer substrate,
the second amplifier and the third amplifier are mounted on the first multilayer substrate,
the first amplifier, the second amplifier, and the third amplifier have a front surface forming a predetermined circuit, and a back surface located on an opposite side from the front surface, respectively,
the front surface of the first amplifier opposes the first multilayer substrate, and the back surface of the first amplifier is separated from the first multilayer substrate,
the back surfaces of the second amplifier and the third amplifier both make contact with the base member,
the back surface of the first amplifier is connected to a first interconnect layer disposed on a surface of the second multilayer substrate, the first interconnect layer is connected to one end of a first via penetrating the second multilayer substrate and the first multilayer substrate, and the other end of the first via is connected to the base member, and
a power consumption of the first amplifier is smaller than a power consumption of each of the second amplifier and the third amplifier.

7. The high-frequency amplifier as claimed in claim 6, wherein
the base member further includes an input terminal to which the high-frequency signal is input from outside, and an output terminal from which the signal amplified by the second amplifier and the third amplifier is output to the outside, the input terminal is connected to one end of a second via penetrating the base member, the first multilayer substrate, and a layer forming a portion of the second multilayer substrate and making contact with the first multilayer substrate, the other end of the second via is connected to an input of the first amplifier, and the output terminal is connected to one end of a third via penetrating a layer forming a portion of the first multilayer substrate and making contact with the base member, and the other end of the third via is connected to outputs of the second amplifier and the third amplifier.

8. The high-frequency amplifier as claimed in claim 7, wherein the output of the first amplifier is connected to one end of a fourth via penetrating a layer forming a portion of the first multilayer substrate and making contact with the second multilayer substrate, and a layer forming a portion of the second multilayer substrate and making contact with the first multilayer substrate, and the other end of the fourth via is connected to inputs of the second amplifier and the third amplifier.

9. A high-frequency amplifier comprising:
a driver amplifier configured to amplify an input high-frequency signal;
a Doherty amplifier, including a carrier amplifier and a peak amplifier, and configured to further amplify a signal output from the driver amplifier;
a first multilayer substrate;
a second multilayer substrate laminated to overlap the first multilayer substrate; and
a base member mounted with the first multilayer substrate and the second multilayer substrate, wherein
the driver amplifier is mounted on the second multilayer substrate,
the carrier amplifier and the peak amplifier are mounted on the first multilayer substrate,
the driver amplifier, the carrier amplifier, and the peak amplifier have a front surface forming a predetermined circuit, and a back surface located on an opposite side from the front surface, respectively,
the back surface of the driver amplifier opposes the first multilayer substrate, and the front surface of the driver amplifier is separated from the first multilayer substrate,
the back surfaces of the carrier amplifier and the peak amplifier both make contact with the base member, respectively, and
the back surface of the driver amplifier is connected to one end of a first via penetrating a layer forming a portion of the second multilayer substrate and in contact with the first multilayer substrate, and the first multilayer substrate, and the other end of the first via is connected to the base member.

10. A high-frequency amplifier comprising:
a first amplifier configured to amplify an input high-frequency signal;
a second amplifier and a third amplifier configured to further amplify a signal output from the first amplifier;
a first multilayer substrate;
a second multilayer substrate laminated to overlap the first multilayer substrate; and
a base member mounted with the first multilayer substrate and the second multilayer substrate, wherein
the first amplifier is mounted on the second multilayer substrate,
the second amplifier and the third amplifier are mounted on the first multilayer substrate,
the first amplifier, the second amplifier, and the third amplifier have a front surface forming a predetermined circuit, and a back surface located on an opposite side from the front surface, respectively,
the back surface of the first amplifier opposes the first multilayer substrate, and the front surface of the first amplifier is separated from the first multilayer substrate,
the back surfaces of the second amplifier and the third amplifier both make contact with the base member, respectively,
the back surface of the first amplifier is connected to one end of a first via penetrating a layer forming a portion of the second multilayer substrate and in contact with the first multilayer substrate, and the first multilayer substrate, and the other end of the first via is connected to the base member, and
a power consumption of the first amplifier is less than a power consumption of each of the second amplifier and the third amplifier.

11. The high-frequency amplifier as claimed in claim 1, further comprising:
a second interconnect layer disposed between the first multilayer substrate and the second multilayer substrate, wherein
the second multilayer substrate includes a first dielectric layer, the first interconnect layer, and a second dielectric layer which are successively laminated, and
the second interconnect layer makes contact with the first dielectric layer and serves as a ground plane with respect to the first interconnect layer, thereby shielding electromagnetic waves generated between and the first multilayer substrate and the second multilayer substrate.

12. The high-frequency amplifier as claimed in claim 6, further comprising:
a second interconnect layer disposed between the first multilayer substrate and the second multilayer substrate, wherein
the second multilayer substrate includes a first dielectric layer, the first interconnect layer, and a second dielectric layer which are successively laminated, and
the second interconnect layer makes contact with the first dielectric layer and serves as a ground plane with respect to the first interconnect layer, thereby shielding electromagnetic waves generated between and the first multilayer substrate and the second multilayer substrate.

* * * * *